United States Patent [19]

Suzuki

[11] 4,061,983

[45] Dec. 6, 1977

[54] TRANSISTOR AMPLIFIER WITH PROTECTIVE CIRCUIT

[75] Inventor: Tadao Suzuki, Tokyo, Japan

[73] Assignee: Sony Corporation, Tokyo, Japan

[21] Appl. No.: 638,297

[22] Filed: Dec. 8, 1975

[30] Foreign Application Priority Data

Dec. 11, 1974 Japan .................... 49-142334

[51] Int. Cl.² ........................................... H03F 21/00
[52] U.S. Cl. ............................. 330/207 P; 330/277; 361/78; 330/298
[58] Field of Search ............... 330/207 P, 35; 361/78

[56] References Cited

U.S. PATENT DOCUMENTS 3,526,810  9/1970  Williams et al. ............. 330/207 P X
3,904,979  9/1975  Suzuki ............................ 307/202 X

*Primary Examiner*—Lawrence J. Dahl
*Attorney, Agent, or Firm*—Hill, Gross, Simpson, Van Santen, Steadman, Chiara & Simpson

[57] ABSTRACT

A transistor amplifier including a bipolar transistor supplied with an input signal and a field effect transistor which is directly connected to an output electrode of the bipolar transistor to amplify a signal applied thereto. The transistor amplifier has a protective circuit which senses the load impedance and actuates a protective means across an input terminal of the transistor amplifier when the sensed load impedance is lower than a predetermined value. Accordingly, the transistor amplifier is protected against overload conditions.

10 Claims, 8 Drawing Figures

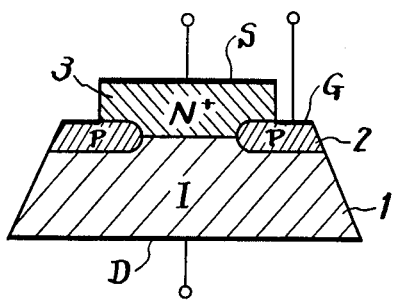
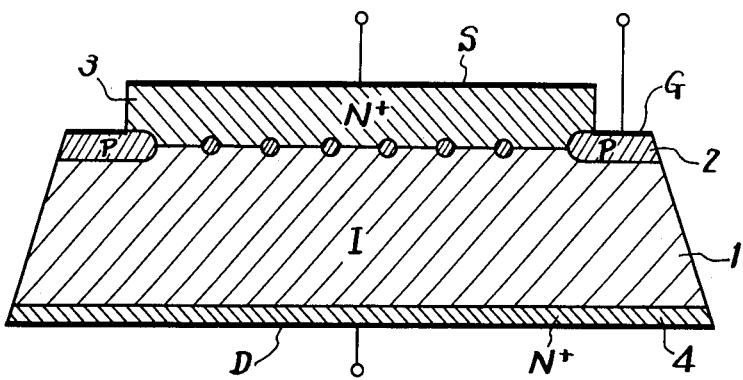
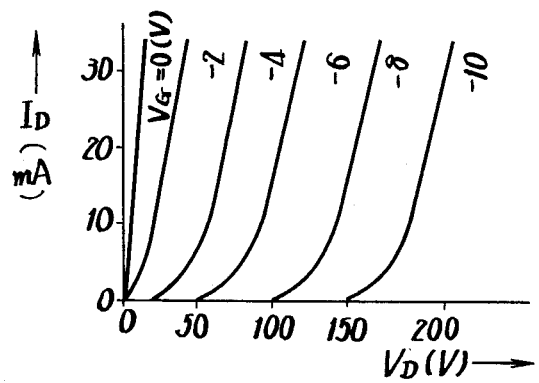

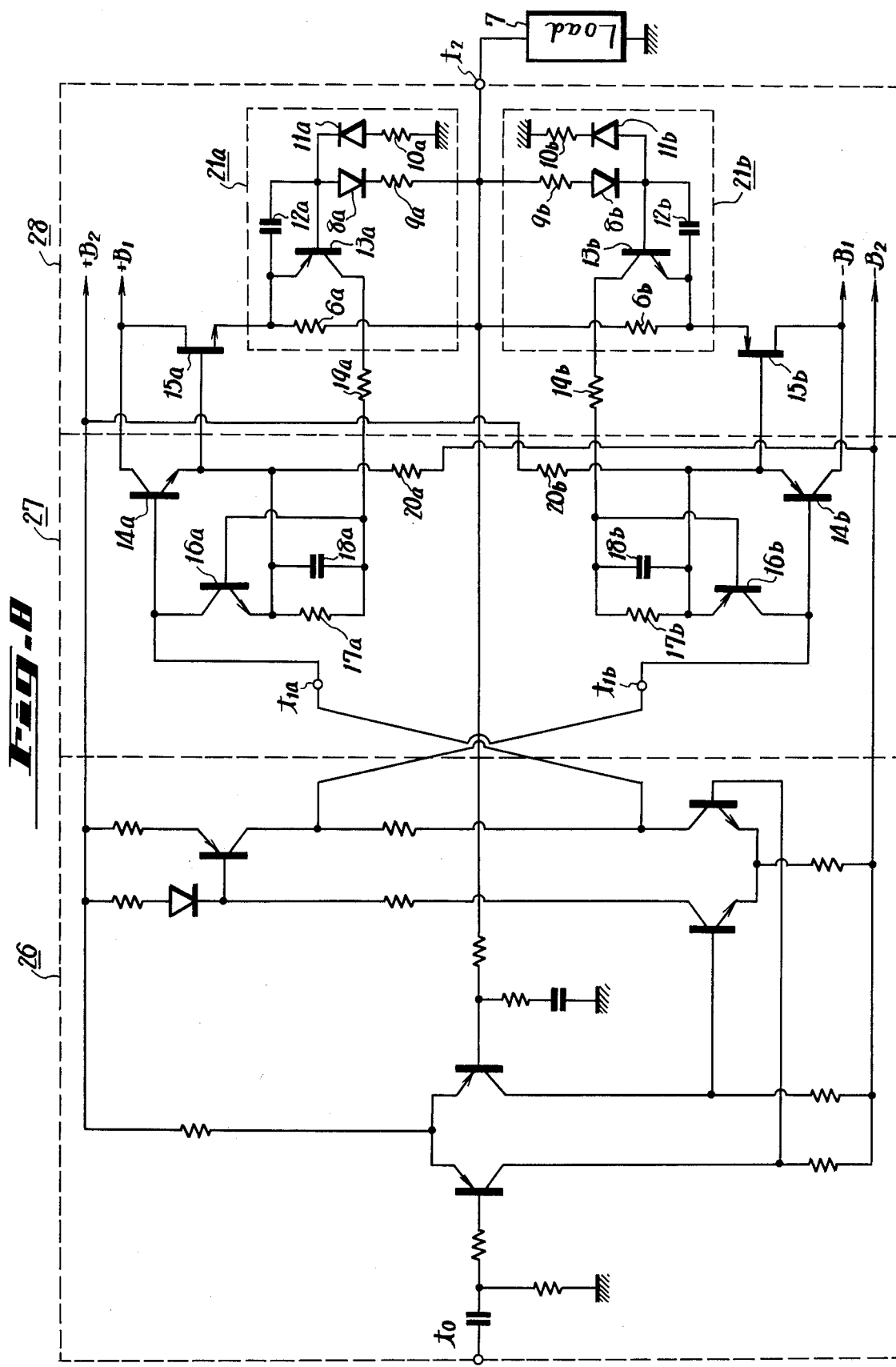

4,061,983

TRANSISTOR AMPLIFIER WITH PROTECTIVE CIRCUIT

BACKGROUND OF THE INVENTION

1. Field of the Invention

The field of art to which this invention pertains is a transistor amplifier and more particularly a transistor amplifier having a protective circuit.

2. Description of the Prior Art

Transistor amplifiers particularly power transistor amplifiers for amplifying audio signals have been provided with protective circuits for protecting a power transistor from being damaged when a load, for example, a loudspeaker is short-circuited. There have been proposed various types of protective circuits. For example, there are methods of sensing the heat of a power transistor, and decoupling its input stage or its load in response to excessive heating. This heat detection is reliable but slow to respond to overload. Other methods of detecting current flowing through the power transistor have been used, however if the load is capacitive, such methods are not effective. A method of eliminating the above defect is disclosed in U.S. Pat. No. 3,904,979, in which there is described an embodiment to protect a power transistor even when the load is capacitive.

Recently, field effect transistors (hereinafter referred to as an FET) having characteristics similar to that of a triode have been used as power transistors. In such an arrangement, as the voltage applied to its gate electrode is increased from a negative voltage to ground potential, the drain current is accordingly increased. In a transistor amplifier using an FET, the input signal is shunted by a control signal from an overload detection circuit, but it is undesirable to hold the gate electrode of the FET in the ground potential. The reason is that if the gate voltage is equal to ground potential, the drain current may increase to the point where the output transistor is destroyed.

SUMMARY OF THE INVENTION

A principal object of this invention is to provide a novel transistor amplifier with a circuit for protecting an FET, used as an amplifier, from being damaged by an overload condition.

Another object of this invention is to provide a transistor amplifier with a protective circuit for preventing an FET from being destroyed by coupling an input electrode of the FET to a bipolar transistor, and an input electrode of the bipolar transistor is shunted by a signal from a protective means.

A further object of this invention is to provide a transistor amplifier with a protective circuit which performs its protective operation when a load impedance is sensed to be lower than a predetermined value.

Another object of this invention is to provide a transistor amplifier with a protective circuit which has a bipolar transistor connected to an input stage, an FET directly connected to an output terminal of the bipolar transistor to amplify a signal supplied thereto, a detecting circuit for detecting the load impedance, and a muting circuit connected to an input terminal of the bipolar transistor and controlled with a signal derived from the detecting circuit.

A further object of this invention is to provide a transistor amplifier with a protective circuit comprising a transistor amplifier which includes a bipolar transistor and an FET directly connected to its output, a circuit for detecting the impedance of a load connected to the FET, a shunt circuit connected to an input of the bipolar transistor, and a negative voltage source connected to an input of the FET, wherein when the detecting circuit is operated, the shunt circuit is actuated and a negative bias is applied to the input of the FET to prevent the FET from being destroyed.

Another object of this invention is to provide a transistor amplifier with a protective circuit which is composed of a bipolar transistor, an FET directly connected to an emitter electrode of the bipolar transistor, a circuit for detecting an overload condition of a load connected to the FET, a switching circuit connected between the base and emitter electrodes of the bipolar transistor and actuated by an output signal of the detecting circuit, and a capacitor connected to the emitter electrode of the bipolar transistor.

These and other objects, features and advantages of the present invention will be apparent from the following description taken in conjunction with the accompanying drawings.

BRIEF DESCRIPTION OF THE DRAWINGS

FIG. 1 is a sectional view showing an example of an FET with triode characteristics that may be used in a transistor amplifier employing a protective circuit according to the present invention;

FIG. 2 is a sectional view of another example of an FET with triode characteristics that may be used in a transistor amplifier with protective circuit according to the present invention;

FIG. 3 is a graph illustrating typical output characteristics of FETs of the types shown in FIGS. 1 and 2;

FIG. 8 is a circuit diagram of a class-AB push-pull amplifier having a transistor amplifier and a protective circuit according to the present invention.

DESCRIPTION OF THE PREFERRED EMBODIMENTS

Figure 4:
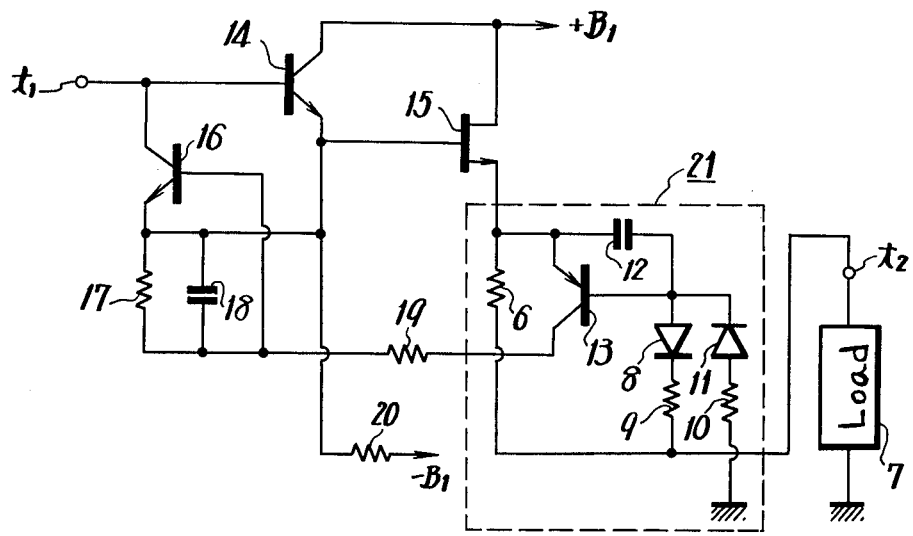
FIG. 4 is a circuit diagram of an example of a transistor amplifier with a protective circuit according to the present invention.

In a preferred embodiment of the invention, there is a newly developed amplifying element, namely a vertical junction type FET having triode characteristics wherein the product of its series resistance and conversion conductance is less than unit and which operates without a punch-through condition extending the total length of a channel. This vertical junction type FET will be described prior to circuit descriptions. Though a hitherto widely known junction type FET has pentode characteristics, the FET of this invention shows triode characteristics, has a low output impedance and a large conversion conductance, so that it operates with extremely high power. This FET is quite suitable for such use as an amplifying element of an output amplifier in an audio circuit.

FIG. 1 shows one example of this vertical junction type FET. The FET is formed of an intrinsic semiconductor region 1 having a low impurity concentration and high resistance, a P-type semiconductor region 2 having an annular configuration and formed on the upper portion of the intrinsic region 1, and an N-type semiconductor region 3 having a high impurity concentration and formed over both the intrinsic region 1 and the P-type region 2. A drain electrode D is formed at the lower surface of the intrinsic region 1, a gate electrode G is formed on the P-type region 2 and a source electrode S is formed on the N-type region 3. As a practically useable vertical junction type FET, a number of FETs of the type shown in FIG. 1 are combined to form a transistor such as shown in FIG. 2 wherein like reference numerals identify corresponding elements. In this FET, the P-type semiconductor region 2 is formed with a mesh-type structure. An additional N+ type semiconductor region 4 having a high impurity concentration is formed under the drain electrode D.

In this vertical junction type FET, the distance between the source electrode S and a channel formed at the periphery of the P-type semiconductor region 2 is short and its channel length itself is also short. In general, the apparent conversion conductance gm of a junction type FET maybe expressed as:

$$gm = \frac{G_m}{1 + R_c \cdot G_m} \quad (1)$$

where $G_m$ is the true conversion conductance and $R_c$ is the series resistance. In the prior art junction type FET, the source-to-channel resistance is high. The channel resistance is high because of its narrow long configuration, and the channel-to-drain resistance is also high. Consequently, the series resistance $R_c$ is very high, so that the apparent conversion conductance gm is substantially equal to the reciprocal of the series resistance $R_c$. For this reason, the prior art junction type FET exhibits pentode characteristic and, as is apparent therefrom, the drain current becomes saturated as the drain voltage is increased.

However, the vertical junction type FET has characteristics such that the series resistance is small, the conversion conductance $G_m$ is large, and the product of the series resistance $R_c$ and the true conversion conductance $G_m$ is less than unity as a whole.

A plot of the drain voltage $V_D$ vs. drain current, $I_D$, characteristic of the vertical junction type FET is graphically represented in FIG. 3. In this case, the abscissa represents the drain voltage $V_D$ in volts (V) and the ordinate represents the drain current $I_D$ in milliampers (mA) with gate voltages $V_G$ of 0, $-2$, $-4$, $-6$, $-8$ and $-10$ V as the parameter. The characteristic curves are analogous to those of so-called triode characteristics. The series resistance $R_c$ is substantially constant even in the environment of voltage variations, and the apparent conversion conductance gm becomes substantially like the true conversion conductance $G_m$ according to variations in width of the depletion layer. Since the product of the conversion conductance $G_m$ and the series resistance $R_c$ is less than unity, the drain voltage, $V_D$ vs. drain current, $I_D$, characteristic of this FET is similar to triode characteristics with the result that large output with little distortion can be obtained. In this case, the series resistance $R_c$ is the sum of the source-to-channel resistance, the channel resistance itself, and the resistance of the semiconductor region 1 which is the source region.

As is apparent from FIG. 3, as the gate voltage $V_G$ is increased from a negative voltage toward ground potential, a large drain current flows even at a low drain voltage $V_D$. Accordingly, it will be understood that when the gate electrode of the FET is grounded due to an overload condition, and the drain electrode of the FET has a constant voltage applied thereto, a large drain current flows therethrough making it impossible to cut off the FET.

In FIG. 4, reference numeral 15 designates an FET being used as an output amplifying element. The FET is an N-channel vertical junction type FET having triode characteristics. The FET 15 forms a source-follower type amplifier circuit, wherein its drain electrode is connected to a positive voltage source $+B_1$, for example, 450 V, and its source electrode is coupled as an output terminal $t_2$ to which a load 7, such as a loudspeaker, is connected.

An NPN-type bipolar transistor, 14, is used as an amplifying element for driving the FET 15. The transistor 14 forms an emitter-follower type amplifier circuit in which its collector electrode is connected to the positive voltage source $+B$, and its emitter electrode is connected to the gate electrode of the FET 15. The base electrode of the transistor 14 is connected to an input terminal $t_1$. The emitter electrode of the transistor 14 and the gate electrode of the FET 15 are both connected through a resistor 20 to a negative voltage source $-B_1$, for example, of $-50$ V.

An overload detecting circuit 21 detects load impedance by the load voltage and the load current and produces a detected output when the load impedance is less than a predetermined value. A PNP-type switching transistor is shown at 13, and a capacitor 12 is connected between its base and emitter electrodes. The emitter electrode of the transistor 13 is connected to the source electrode of the FET 15, while the source electrode of the FET 15 is connected through a small resistor 6 for detecting the load current to the output terminal $t_2$. The base electrode of the transistor 13 is connected through a series circuit of a rectifying diode 8 and a resistor 9 to the output terminal $t_2$ and also grounded through a series circuit of a resistor 10 and a rectifying diode 11. In this case, the diode 8 is connected with its anode at the base side of the transistor 13, while the diode 11 is connected with its anode at the ground side.

A transistor 16 is a switching element which forms a muting circuit. The collector electrode of the transistor 16 is connected to the base electrode of the transistor 14, its emitter electrode is connected to the emitter electrode of the transistor 14, and its base electrode is connected through a resistor 19 to the collector electrode of the transistor 13. A parallel circuit of a resistor 17 and a capacitor 18 is connected between the base and emitter electrodes of the transistor 16.

The operation of the circuit of FIG. 4 is described below. If the load impedance becomes less than a limit load impedance $R_6R_{10}/R_9$ which is determined by respective resistances $R_6$, $R_9$ and $R_{10}$, a voltage across the capacitor 12 exceeds the base-emitter voltage $V_{BE}$ of the transistor 13, and the transistor 13 becomes conductive thereby to make the transistor 16 conductive. Consequently, the transistor 14 is turned "off" to lower the gate potential of the FET 15 to a negative value less than its pinch-off voltage so that the FET 15 becomes non-conductive, too. Thus, the FET 15 is prevented from damage which could be caused by the overload. In this case, the gate voltage of the FET 15 is not switched to the reference potential (the ground potential). The bipolar transistor 14 is provided at the input stage of the FET 15, and the base voltage of this transistor 14 is switched to the reference potential. Since the gate electrode of the transistor 15 is connected to the negative voltage source $-B_1$, the gate potential is shifted to the negative side. As a result, no substantial drain current flows and hence the FET 15 is protected from being damaged by the overload condition.

Figure 5:
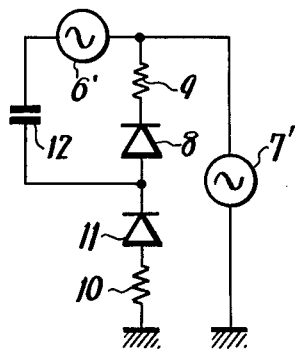
FIG. 5 is an equivalent circuit used for explaining the circuit of the present invention.

The operation of the overload detecting circuit 21 will be described below. FIG. 5 shows an equivalent circuit of the circuit 21. In the circuit 21, if the load current is taken as $i_o$, the load voltage as $e_o$, and the resistance values of the respective resistors 6, 9 and 10 as $R_6$, $R_9$ and $R_{10}$, the resistor 6 is shown as a voltage source 6' with an electromotive force $i_o R_l$, and the load 7 is shown as a voltage source 7' with an electromotive force $e_o$. The capacitor 12 is charged by the output from the voltage source 6' and discharged by the output from the voltage source 7'. In other words, the voltages $i_o R_l$ and $e_o$ are subjected to a peak-value-rectification by the diodes 8 and 11 and supplied to the capacitor 12 in opposite polarities.

In this case, the forward resistances of the diodes 8 and 11 are neglected, and their forward voltage drops are taken as $V_{f1}$ and $V_{f2}$. If a current flowing through this equivalent circuit at its stationary condition is taken as $i$, a terminal voltage across the capacitor 12 as V, the peak value of the current $i_o$ as $i_p$, and the peak value of the voltage $e_o$ as $e_p$, and the peak value of the voltage $e_o$ as $e_p$, the following equations are obtained.

$$-e_p + V_{f1} + V_{f2} + (R_9 + R_{10}) \cdot i = 0 \qquad 1$$

$$V = R_6 \cdot i_p - V_{f1} - R_9 \cdot i \qquad 2$$

From the equations (1) and (2), the following equation is derived by cancelling the current $i$.

$$V = R_6 \cdot i_p - V_{f1} - \frac{R_9}{R_9 + R_{10}} (e_p - V_{f1} - V_{f2}) \qquad (3)$$

When the voltage V expressed by the above equation (3) exceeds the voltage drop $V_{BE}$ across the base-emitter of the transistor 13, the transistor 13 becomes conductive to produce an overload detecting signal.

If the equation (3) is rewritten on the assumption of $V = V_{BE}$, the following equation (4) is obtained.

$$i_p = \frac{R_9}{R_{10}} \cdot \frac{e_p}{R_9 + R_{10}} + \frac{V_{f1}}{R_6} + \frac{V_{BE}}{R_6} - \frac{R_9}{R_6} \cdot \frac{V_{f1}}{R_9 + R_{10}} - \frac{R_9}{R_6} \cdot \frac{V_{f2}}{R_9 + R_{10}} \qquad (4)$$

Where, let it be assumed that $$\frac{V_{f1}}{R_6} + \frac{V_{BE}}{R_6} - \frac{R_9}{R_6} \cdot \frac{V_{f1}}{R_9 + R_{10}} - \frac{R_9}{R_6} \cdot \frac{V_{f2}}{R_9 + R_{10}} = \frac{K}{R_6} \text{ and}$$

$$\frac{e_p}{i_p} = Z$$

In other words, since the voltages $i_o R_6$ and $e_o$ are peak-value-rectified by the diodes 8 and 11 and converted to a DC voltage by the capacitor 12, the terminal voltage V across the capacitor 12 becomes independent of the phase difference between the current $i_o$ and the voltage $e_o$ and takes on a value related to the peak values $i_p$ and $e_p$. Thus, the factor $Z = e_p/i_p$ shows not only the pure resistance component of the load 7, but also its impedance component.

If the factors Z and $K/R_6$ are used, the equation (4) can be rewritten as follows:

$$i_p = \frac{K}{R_6 - \frac{R_2 \cdot Z}{R_9 + R_{10}}} \qquad (5)$$

If the value of the load impedance Z for satisfying the condition $i_p = \infty$ is taken as $Z\infty$, the value $Z\infty$ is obtained from the equation (5) as follows:

$$Z_\infty = \frac{R_6(R_9 + R_{10})}{R_9} \qquad (6)$$

When the load impedance Z is greater than the value obtained by the equation (6), the current $i_p$ becomes negative and hence the transistor 13 is not made conductive. However, in the case where the load impedance Z is smaller than the value $Z\infty$, when the current $i_p$ becomes greater than that obtained by the equation (5), the transistor 13 is made conductive to produce the overload detecting signal.

Figure 6:
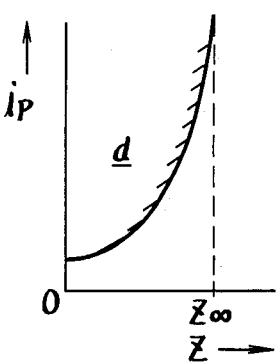
FIGS. 6 and 7 are graphs used for explaining the operational characteristics of the protective circuit of the present invention.
Figure 7:
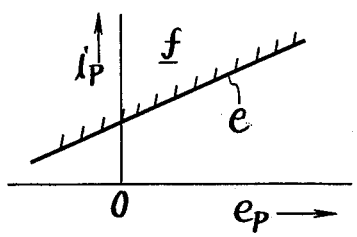

Equation (5) is shown by a curve in FIG. 6, in which a region $d$ is such a region that the transistor 13 becomes conductive to produce the overload detecting signal. Furthermore the equation (4) is shown by a line in FIG. 7. When the load 7 is a pure resistor, the transistor 13 becomes conductive in a region $f$ to produce the overload detecting signal.

In FIG. 4, the resistor 19 prevents the transistor 14 from being turned on when the transistor 13 becomes conductive due to the fact that the output of the transistor 13 causes the transistor 14 to raise its base potential. The resistor 17 prevents the transistor 14 from being turned on acording to the collector cut-off current $I_{CBO}$ of the transistor 13. The capacitor 18 prevents the transistor 14 from being turned on when the transistor 13 is nonconductive due to the fact that the base input impedance of the transistor 16 is increased by the instantaneous increase of its base input voltage.

In addition, if the resistor 20 is formed of a series connection of two resistors, and the connection point of these two resistors is connected to the emitter electrode of the transistor 16 to keep its emitter potential negative, the transistor 16 can be nonconductive in every operating region of the FET 15.

Another embodiment of the invention is shown in FIG. 8. Reference numeral 28 designates a pure complementary class-AB push-pull amplifier circuit composed of N-channel and P-channel vertical junction type FETs 15a and 15b which correspond to the FET 15 of FIG. 4. A driving amplifier circuit 27 is composed of NPN-type and PNP-type transistors 14a and 14b corresponding to the transistor 14 of FIG. 4. Reference numeral 26 denotes a class-A amplifier circuit with 2-stage construction provided at the front stage of the driving amplifier circuit 27. A signal supplied to an imput terminal $t_o$ is amplified by the amplifier 26 and supplied to the respective transistors 14a and 14b of the amplifier 27. The transistors 14a and 14b are also applied with bias voltages by the rear-stage amplifier in the circuit 26. The emitter electrodes of the transistors 14a and 14b are respectively connected through resistors 20a and 20b to voltage sources $-B_2$ and $+B_2$.

The remaining circuit features are similar to that of FIG. 4, so that elements in FIG. 8 corresponding to those of FIG. 4 are expressed by the same reference numerals with a and b being respectively affixed thereto. Consequently, repeated description is omitted. In this case, however, the transistors 13a and 13b are respectively a PNP-type and an NPN-type, and the transistors 16a and 16b are respectively an NPN-type and a PNP-type.

Instead of both of overload detecting circuits 21a and 21b, one circuit 21a can be provided. In this case, the emitter electrode of the transistor 13a is connected to the source electrode of the FET 15a, but its base electrode is connected through a series circuit of the diode 8a and the resistor 9a to the source electrode of the FET 15b. Thus, the transistors 16a and 16b are simultaneously controlled "on" and "off" by the output signal of the transistor 13a.

According to the present invention as described above, the transistor amplifier with its protective circuit comprises an amplifying bipolar transistor with its base electrode being applied with an input signal, an amplifying FET with its gate electrode being directly connected to an output electrode of the bipolar transistor, an overoad detecting circuit connected to the FET, and a switching element connected between the base and emitter electrodes of the bipolar transistor, wherein a first voltage source with one polarity is connected to each one output electrode of the bipolar transistor and the FET, and a second voltage source with the other polarity is connected to the other output electrode of the bipolar transistor and to the gate electrode of the FET, whereby when it becomes overloaded, the switching element is rendered conductive by the detected output of the overload detecting circuit to make both the bipolar transistor ad the FET nonconductive. As a result, the FET as the amplifying element of the amplifier circuit is protected from being damaged by the overload condition.

The load impedance is detected by the overload detecting circuit and when the value of the detected load impedance is less than a predetermined value, the switching element is turned "on". Even though the load current is quite large, the FET will not stop its amplifying operation unless the load impedance becomes a minimum as occurs at a short-circuit condition or the like to the former. When the load includes a large reactance in addition to resistance such as a condenser speaker, even if the load current is increased, there is only a temporary loss of FET operation. Consequently, the FET is protected and the output signal is maintained.

The above mentioned FET may also have a pentode characteristic and may be of junction type of MOS type. The switching element is not limited to a bipolar transistor, and another semiconductor switching element is also useable therefor.

It will be apparent that many modifications and variations may be effected without departing from the scope of the novel concepts of this invention.

I claim as my invention:

1. The combination of a transistor amplifier and an associated protective circuit comprising:

a first amplifying stage having input and output terminals, said first amplifying stage comprising a bipolar transistor with a field effect transistor having a triode characteristic, low output impedance and large convergence conductance, each of said transistors having first, second and third electrodes, the first electrode of said bipolar transistor being coupled to said input terminal, the second electrodes of said bipolar and field effect transistors being coupled to a first voltage source, the third electrode of said bipolar transistor being coupled to the first electrode of said field effect transistor, the third electrode of said field effect transistor being coupled to said output terminal, and the third electrode of said bipolar transistor and the first electrode of said field effect transistor being coupled to a second voltage source which has a polarity opposite to that of the first voltage source;

a load connected to the output terminals of said first amplifying stage;

a second amplifying stage having a second input terminal coupled to said input stage and a second output terminal coupled to said output terminal of said first amplifying stage and amplifying a signal having a different polarity from that of said signal applied to said first amplifying stage, said second amplifying stage comprising second bipolar and field effect transistors which are respectively different in type from the transistors of said first amplifying stage and each of which has first, second and third electrodes, the first electrode of said second bipolar transistor being coupled to said second input terminal, the second electrode of said second bipolar and field effect transistors being coupled to a third voltage source, the third electrode of said second bipolar transistor being coupled to the first electrode of said second field effect transistor, the third electrode of said second field effect transistor being coupled to said second output terminal, and the third electrode of said second bipolar transistor and the first electrode of said second field effect transistor being coupled to a fourth voltage source which is opposite in polarity to said third voltage source;

a first detecting circuit for detecting an overload condition of said amplifying stage thereby to produce a control signal;

a second detecting circuit for detecting an overload condition of said second amplifying stage thereby to produce a second control signal;

a first muting circuit connected to said input terminals of said amplifying stage, said first muting circuit including a switching element coupled between the first and third electrodes of said bipolar transistor, and means for applying a control signal from the first detecting circuit to said switching element and means causing said switching element to turn off said bipolar and field effect transistors, when said control signal indicates an overload condition; and a second muting circuit connected to said second input terminal of said second amplifying stage, said second muting circuit comprising a second switching element coupled between the first and third electrodes of said second bipolar transistor; and means for applying a control signal from the second detecting circuit to said second switching element and means causing said second switching element to turn off said second bipolar and second field effect transistors when said control signal from said second detecting circuit indicates an overload condition.

2. A transistor amplifier and protective circuit in accordance with claim 1, wherein the first, second and third electrodes of said second bipolar transistor are base, collector and emitter electrodes; the first, second and third electrodes of said second field effect transistor are gate, drain and source electrodes; and said switching element of the second muting circuit is a transistor having collector, emitter and base electrodes; the collector and emitter electrodes of the last mentioned transistor being coupled between the base and emitter electrodes of said second bipolar transistor, and the base electrode thereof being coupled to said second detecting circuit.

3. A transistor amplifier and protective circuit in accordance with claim 1, wherein a resistance means is connected between the base electrode of said second muting circuit transistor and said second detecting circuit.

4. A transistor amplifier and protective circuit in accordance with claim 1, wherein a capacitor is coupled between the emitter electrode of said second bipolar transistor and said second detecting circuit.

5. A transistor amplifier and protective circuit in accordance with claim 1, wherein a resistance means is coupled between the emitter electrode of the second muting circuit transistor and said second detecting circuit.

6. A transistor amplifier and protective circuit in accordance with claim 1, wherein said second detecting circuit comprises a first resistance means coupled between said second field effect transistor and said load, a first series circuit coupled in parallel with said first resistance means and including a capacitor, a first diode and a second resistance means, a second series circuit coupled to a circuit point between said capacitor and said first diode and including a second diode and a third resistance means, and a second switching element coupled in circuit therewith to be responsive to a predetermined potential difference developed across said capacitor.

7. A transistor amplifier and protective circuit therefor for feeding an amplified signal to a load to be driven thereby comprising an amplifying bipolar transistor having its base electrode arranged to be supplied with an input signal to be amplified, an amplifying FET having its output directly connected to said load and its gate electrode directly connected to an output electrode of said bipolar transistor, an overload detecting circuit connected to said FET, and a switching element connecting between the base and emitter electrodes of said bipolar transistor, wherein a first voltage source of one polarity is connected to each one output electrode of said bipolar transistor and said FET and a second voltage source of the other polarity is connected to the other output electrode of said bipolar transistor and to the gate electrode of said FET, whereby when said FET becomes overloaded said switching element is rendered conductive by the detected output of the overload detecting circuit to make both said bipolar transistor and said FET non-conductive.

8. A transistor amplifier and protective circuit therefor for feeding an amplified signal to a load to be driven thereby comprising an amplifying bipolar transistor having its base electrode arranged to be supplied with an input signal to be amplified, an amplifying FET of the vertical field effect type having a triode characteristic and low output impedance, said FET having its output directly connected to said load and its gate electrode directly connected to an output electrode of said bipolar transistor, an overload detecting circuit connected to said FET on its output side, and a switching element connecting between the base and emitter electrodes of said bipolar transistor, a first voltage source of one polarity being connected to each one output electrode of said bipolar transistor and said FET and a second voltage source of the other polarity being connected to the other output electrode of said bipolar transistor and to the gate electrode of said FET, whereby when said FET becomes overloaded said switching element is rendered conductive by the detected output of the overload detecting circuit to make both said bipolar transistor and said FET non-conductive.

9. A transistor amplifier comprising a FET power amplifier, said FET being of the vertical field effect type having a triode characteristic and low output impedance, the source-drain-channel of said FET being connected between a voltage source and a load terminal, circuit means between said FET power amplifier and said load for detecting a drop in the impedance of the load below a predetermined level, means for creating a control signal for turning off completely said FET when said detecting means determines that the load impedance has fallen below said predetermined level of said load, and circuit means for shunting the input signal around said FET when a load impedance is detected below said predetermined load impedance level.

10. The combination of a transistor amplifier and a protective circuit comprising:
an amplifying stage having input and output terminals;
said amplifying stage including a field effect transistor having a control means and a further transistor coupled to the control means of said field effect transistor;
a load coupled in circuit with said output terminals of the amplifying stage;
a detecting stage for detecting an overload condition for said amplifying stage;
a muting stage for limiting the operation of said amplifying stage in response to a signal received from said detecting stage;
means for coupling said signal from said detecting stage to said muting circuit;
means for coupling an output of said muting circuit to one of the electrodes of said further transistor to control the operation thereof, and hence to control the operation of said field effect transistor;
wherein the first, second and third electrodes of said bipolar transistor are respectively base, collector and emitter electrodes, the first, second and third electrodes of said field effect transistor are respectively gate, drain and source electrodes, said switching element of the muting circuit is a transistor having collector, emitter and base electrodes, the collector and emitter electrodes of the last said transistor being connected between the base and emiiter electrodes of said bipolar transistor and the base electrode of the last said transistor being connected to said detecting circuit; and
wherein said detecting circuit comprises a first resistance means coupled between said field effect transistor and said load; a first series circuit coupled in parallel with said first resistance means and including a capacitor, a first diode and a second resistance means; a second series circuit coupled from a point between said capacitor and said first diode and including a second diode and a third resistance means; and a second switching element coupled in circuit therewith to be responsive to a predetermined potential difference developed across said capacitor.

* * * * *